(12) United States Patent
Maleki et al.

(10) Patent No.: US 11,127,685 B2
(45) Date of Patent: Sep. 21, 2021

(54) POWER SEMICONDUCTOR MODULE WITH DIMPLES IN METALLIZATION LAYER BELOW FOOT OF TERMINAL

(71) Applicant: ABB Power Grids Switzerland AG, Baden (CH)

(72) Inventors: Milad Maleki, Baden (CH); Fabian Fischer, Baden (CH); Dominik Trüssel, Bremgarten (CH); Remi-Alain Guillemin, Windisch (CH); Daniel Schneider, Bellikon (CH)

(73) Assignee: ABB Power Grids Switzerland AG, Baden (CH)

( * ) Notice: Subject to any disclaimer, the term of this patent is extended or adjusted under 35 U.S.C. 154(b) by 0 days.

(21) Appl. No.: 16/737,356

(22) Filed: Jan. 8, 2020

(65) Prior Publication Data

US 2020/0144188 A1  May 7, 2020

Related U.S. Application Data

(63) Continuation of application No. PCT/EP2018/067238, filed on Jun. 27, 2018.

(30) Foreign Application Priority Data

Jul. 10, 2017  (EP) .................................... 17180599

(51) Int. Cl.
*H01L 23/538* (2006.01)
*H01L 23/13* (2006.01)
(Continued)

(52) U.S. Cl.
CPC .......... *H01L 23/5383* (2013.01); *H01L 23/13* (2013.01); *H01L 23/49838* (2013.01);
(Continued)

(58) Field of Classification Search
CPC ................. H01L 23/5383; H01L 23/13; H01L 23/49838; H01L 23/49861; H01L 24/48;
(Continued)

(56) References Cited

U.S. PATENT DOCUMENTS

| 5,527,620 A | 6/1996 | Schulz-Harder |
| 2001/0018235 A1* | 8/2001 | Choi .................. H01L 24/97 438/122 |

(Continued)

FOREIGN PATENT DOCUMENTS

| DE | 1011185 B | 6/1957 |
| DE | 10337640 A1 | 3/2005 |

(Continued)

OTHER PUBLICATIONS

European Patent Office, International Search Report & Written Opinion issued in corresponding Application No. PCT/EP2018/067238, dated Sep. 5, 2018, 10 pp.

*Primary Examiner* — Robert G Bachner
(74) *Attorney, Agent, or Firm* — Slater Matsil, LLP

(57) ABSTRACT

A power semiconductor module includes an insulating substrate with a top metallization layer; a semiconductor chip bonded to the top metallization layer; and a terminal welded with a foot to the top metallization layer and electrically interconnected to the semiconductor chip. At least one of the top metallization layer and a bottom metallization layer of the substrate provided opposite to the top metallization layer comprises a plurality of dimples, which are distributed in a connection region below and/or around the welded foot.

21 Claims, 4 Drawing Sheets

(51) Int. Cl.
 *H01L 23/498* (2006.01)
 *H01L 23/00* (2006.01)
 *H05K 3/34* (2006.01)

(52) U.S. Cl.
 CPC ........ *H01L 23/49861* (2013.01); *H01L 24/48* (2013.01); *H01L 24/49* (2013.01); *H05K 3/341* (2013.01); *H01L 2224/48137* (2013.01); *H01L 2224/49113* (2013.01); *H01L 2224/49175* (2013.01); *H01L 2924/15787* (2013.01)

(58) Field of Classification Search
 CPC ........... H01L 24/49; H01L 2224/48137; H01L 2224/49113; H01L 2224/49175; H01L 2924/15787; H05K 3/341
 See application file for complete search history.

(56) References Cited

U.S. PATENT DOCUMENTS

| | | | |
|---|---|---|---|
| 2004/0108602 A1 | 6/2004 | Nakajima et al. | |
| 2005/0046020 A1* | 3/2005 | Andou | H01L 23/4334 257/724 |
| 2008/0164588 A1 | 7/2008 | Lee et al. | |
| 2011/0298121 A1 | 12/2011 | Nishibori et al. | |

FOREIGN PATENT DOCUMENTS

| | | |
|---|---|---|
| DE | 102004019568 A1 | 11/2005 |
| EP | 0632681 A2 | 1/1995 |
| JP | 2005191178 A | 7/2005 |
| JP | 2009094135 A | 4/2009 |

* cited by examiner

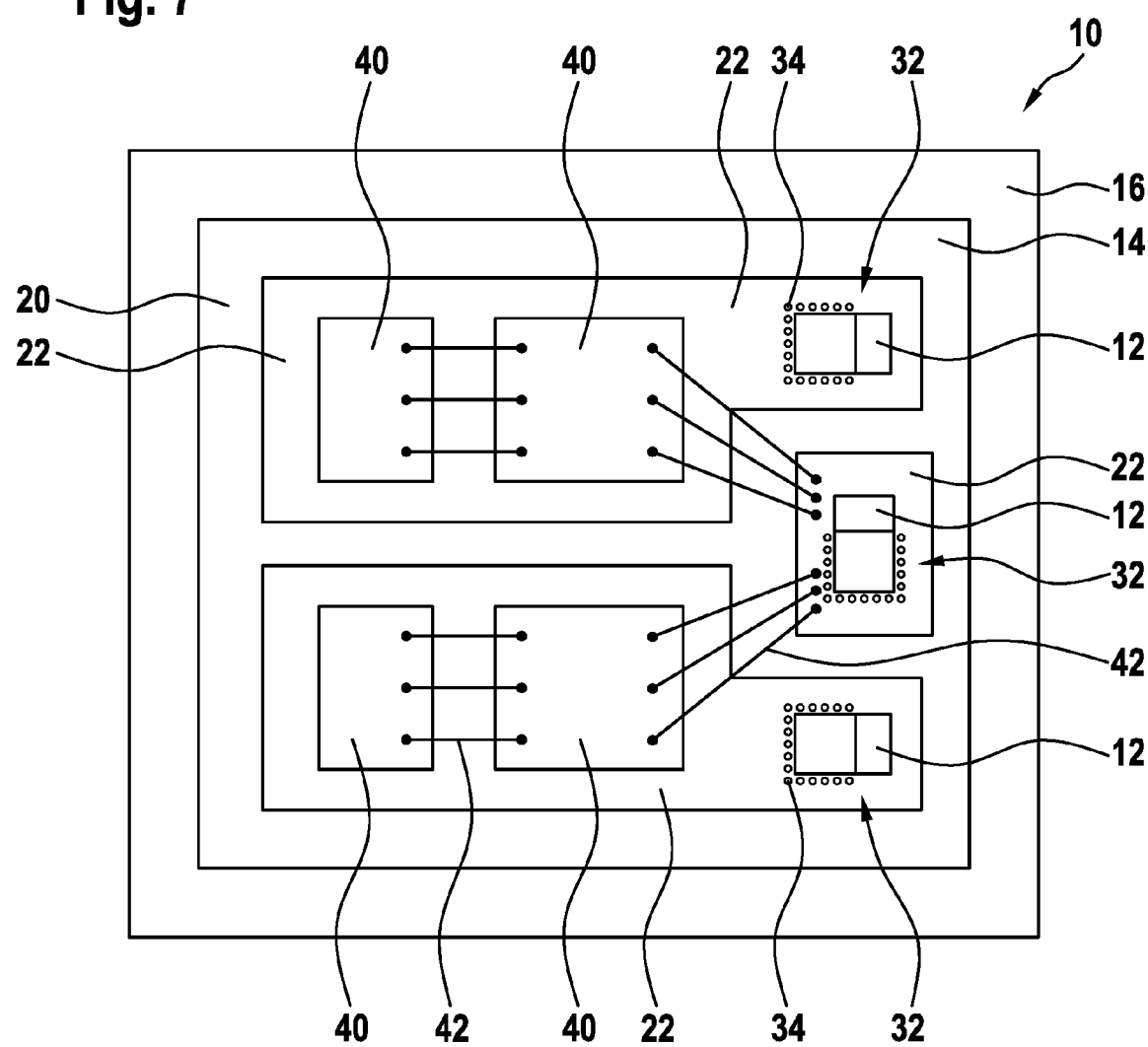

POWER SEMICONDUCTOR MODULE WITH DIMPLES IN METALLIZATION LAYER BELOW FOOT OF TERMINAL

FIELD OF THE INVENTION

The invention relates to a power semiconductor module and a method of manufacturing a power semiconductor module.

BACKGROUND OF THE INVENTION

Power semiconductor modules usually contain a substrate to which one or more power semiconductor chips, their electrical connections and several terminals are bonded. The terminals may be used for power and auxiliary connections. The substrate may be composed of a ceramics layer with two metallization layers on bottom and top of the ceramics layer.

The conventional method for joining terminal to substrate is soldering. However, ultrasonic welding may be a preferred technique for terminal attachment in power semiconductor modules due to considerably better thermo-mechanical reliability and lower cost. Ultrasonic welding may be seen as a mixture of friction welding (i.e. relative movement of the joining partners) and pressure welding, which usually happen at a high temperature. The welding pressure and a significant thermal gradient in the terminal and its connection region on the substrate during welding may cause high stress in the substrate. Note that the local temperature in the welding zone may be even above 300° C. during ultrasonic welding of a typical terminal.

The load source of such stress may be classified in three categories: Thermal load caused by CTE (coefficient of thermal expansion) mismatch of adjacent components, thermal load caused by thermal gradient inside the ceramics, and mechanical load caused by pressure. This stress may cause conchoidal and also open cracks in the ceramics of substrate under the welding foot, mainly under the foot edges. Such a crack may influence the reliability of the power semiconductor module, as it may cause isolation breakdown or brittle fracture of the ceramics during service. Moreover, a detection of such a tiny crack without removing (such as etching) of the metallization is not easily feasible. According to current state of the art, there is no reliable non-destructive test for the detection of cracks under the metallization layer.

There are several different approaches to reduce the crack formation rate. As an example, welding with softer parameters (like lower energy, pressure and/or amplitude) may decrease the ceramics crack probability. However, such an approach may lead to a less strong weld with a smaller contact surface. As another example, using ceramics with higher toughness or better quality may reduce the ceramics cracking rate. However, these material optimizations may impose additional costs. Furthermore, a lower ceramics cracking may be achieved with a thinner terminal feet. However, this may impose penalties in electrical performance.

DE 101 11 185 A1 shows a metal-ceramic substrate with a profiling in a metal layer for reducing thermodynamic stresses in the metallization and soldering layer. The profiling is provided in the vicinity of electrical components or contact elements which are soldered to the metal layer.

DE 10 2004 019 568 A1 relates to a power semiconductor module with a semiconductor chip and a connection element soldered to a metallization layer of a substrate. Indentions are present in the metallization layer below or besides the connection element. The connection element is soldered to the metallization layer with the indents.

DE 103 37 640 A1 relates to a power semiconductor module with a substrate, which comprises two metallization layers on an isolating body. Semiconductor elements are soldered to the upper metallization layer. The lower metallization layer has indents.

US 2011/298 121 A1 shows a power semiconductor device with semiconductor elements and a terminal soldered to an insulating substrate. Dimples are formed in an metallization layer of the insulating substrate.

DESCRIPTION OF THE INVENTION

It is an object of the invention to provide a power semiconductor module with welded terminals, which is more reliable, has a strong weld and has good electric properties without substantially increasing manufacturing costs.

This objective is achieved by the subject-matter of the independent claims. Further exemplary embodiments are evident from the dependent claims and the following description.

An aspect of the invention relates to a power semiconductor module. A power semiconductor module may be any device that mechanically and electrically interconnects one or more power semiconductor chips and their electrical interconnections. It has to be noted that the term "power" here and in the following may refer to devices adapted for processing voltages of more than 100 V and/or 10 A. For example, a voltage rating for the power semiconductor chip may range between 600 V and 10 kV.

According to an embodiment of the invention, the power semiconductor module comprises an insulating substrate with a top metallization layer, a semiconductor chip bonded, such as soldered or sintered, to the top metallization layer and a terminal connected and in particular welded with a foot to the top metallization layer and electrically interconnected to the semiconductor chip. Furthermore, the insulating substrate may comprise a bottom metallization layer.

The semiconductor chip may provide a diode or a semiconductor switch, which may be adapted for switching a current through a power semiconductor. A power semiconductor switch may be a thyristor or transistor such as an IGBT, MOSFET, etc. the one and more semiconductor chips bonded to the substrate and their electrical interconnections may form a power circuit that may be accessed with the one or more terminals.

The foot of the terminal is welded to the top metallization layer in the connection region. The terminal may be a power terminal or an auxiliary terminal. In general, the terminal may comprise a foot, which is used for welding of the terminal to the top metallization layer, and a pin part, which may be used for interconnecting the terminal to a further conductor. The foot may run substantially parallel to the top metallization layer, while the pin part may protrude from the top metallization layer and/or may be aligned substantially orthogonal to the foot. The terminal may be a metallic terminal, for example made of Cu, Al, etc.

At least one of the top metallization layer and a bottom metallization layer provided opposite to the top metallization layer comprises a plurality of dimples, which are distributed in a connection region below and/or around the welded foot.

In other words, the top and/or bottom metallization layer may contain dimples around and/or under the foot of terminal. Experiments have shown that dimples in the one or more metallization layers at the circumference of the welded foot and/or under the welded foot reduce ceramic crack during a welding process, such as an ultrasonic welding process. In particular, the experiments showed that the rate of ceramic cracks in dimpled substrate is about 2.5 times lower than the crack rate with a substrate without dimples. Furthermore, the dimples result in no or nearly no degradation in the contact area between the foot and the top metallization layer and accordingly in weld strength.

The reasons for the reduced crack rate caused by the dimples may be as follows: As the ceramics crack is usually initiated under the foot edge during welding, the dimples in the metallization layer below and/or near the foot cause a stress relaxation in the connection region. Hence, a lower load may be transferred to the ceramics during the welding process, which eventually decrease the ceramics cracking rate.

A dimple may be any depression in the metallization layer, which has a maximal diameter that is "small" with respect to a thickness of the metallization layer. The maximal diameter of a dimple may be the maximal distance between two arbitrary points on the edge of the dimple. The maximal diameter may be smaller with respect to a thickness of the metallization layer, when the maximal diameter is less than five times the thickness of the metallization layer.

The dimples may have any shape. For example, the dimples may be spherical and/or conical. From a view from above onto the metallization layer, the dimples may be circular, elliptical and/or elongated.

The connection region, in which the dimples for a foot are arranged, may comprise the contact area between the foot and the top metallization layer and in particular may be larger than the contact area. At any side of the foot, the connection region may protrude over an edge of the foot. In such a way, the stress caused by the welding may be relaxed not only under the foot but also near the foot. Furthermore, the connection region larger than the contact area may reduce the exactness with which the foot has to be placed on the top metallization layer during the welding.

According to an embodiment of the invention, the dimples may be provided solely in the top metallization layer. There may be no dimples below the foot and or in the connection region of the foot in the bottom metallization layer. This may facilitate the manufacturing of the substrate, when, for example, the bottom metallization layer is not structured.

According to an embodiment of the invention, the dimples may be provided solely in the bottom metallization layer. There may be no dimples below the foot and or in the connection region of the foot in the top metallization layer. This may increase the welding strength and/or the contact area between the top metallization layer and the foot.

According to an embodiment of the invention, the dimples may be provided in both the top metallization layer and the bottom metallization layer. This may recite in a very high welding stress mitigation due to the dimples. In this case, the dimples may be arranged opposite to each other, i.e. a dimple in the top metallization layer may be opposite to a dimple in the bottom metallization layer.

According to an embodiment of the invention, the dimples are distributed at least one of: below the foot, below an edge of the foot, and/or outside an edge of the foot. In general, the dimples may be situated under and/or surrounding the foot of the terminal. The dimples may be only at the circumference of the foot of the terminal and/or only at one side of the foot of the terminal.

When dimples are arranged below the foot than from a view from above onto the metallization layer, the dimples are situated inside the edge of the foot. Contrary to this, when dimples are arranged outside the edge of the foot, they may be completely outside of the edge of the foot, i.e. may not intersect the edge of the foot. Furthermore, when dimples are arranged below an edge of the foot, from a view from above onto the metallization layer, they may intersect the edge of the foot.

It has to be noted that the foot may have any shape. For example, the foot may be rectangular, circular, half-elliptical, etc. Also, the edge of the foot may have this shape. The dimples may run along an edge of the foot. Accordingly, dimples arranged below an edge of the foot and or outside of an edge of the foot may be arranged in a rectangular, circular, half-elliptical, etc. pattern.

In general, the area within the connection region, where the dimples are distributed, influences the position at which stress during welding is mitigated. When the pressure during welding is higher within the contact area, it may be beneficial to provide dimples that are arranged within the edge of the foot. On the other hand, when the pressure is higher near the edge of the foot, then dimples that arranged near and/or below the foot may be beneficial.

According to an embodiment of the invention, the dimples are solely distributed below the foot, i.e. inside an edge of the foot or the dimples are solely distributed outside an edge of the foot. In such a way, the number of dimples may be reduced, which may increase the contact area and/or the welding strength between the foot and the top metallization layer.

Analogously, when the dimples are provided in the bottom metallization layer, the contact area and/or the attachment strength between the bottom metallization layer and a base plate may be increased.

In general, the height (i.e. deepness) of dimples may be smaller and/or equal to metallization thickness.

According to an embodiment of the invention, the dimples have a depth smaller than a thickness of the metallization layer. In such a way, the substrate is not exposed to an outside due to a dimple.

According to an embodiment of the invention, the dimples reach through the metallization layer. The higher the dimples depth, the higher the stress relief and lower ceramic crack rate may be.

Furthermore, the arrangement of the dimples with respect to each other and/or their relative extension may have influence on the stress relief during the welding.

According to an embodiment of the invention, neighboring dimples have a distance with respect to each other of less than three diameters of the dimples. For example, a maximal diameter of the dimples may be smaller than a minimal distance between the dimples. In such a way, the bridges between neighboring dimples may be small and/or may be more elastic to mitigate stress.

According to an embodiment of the invention, the connection region protrudes under the foot at least ¼ of a maximal diameter of the foot. Analogously, dimples outside of an edge of the foot have a maximal distance from the edge of the foot of less than ¼ of a maximal diameter of the foot. The connection region may be defined as the region surrounding the contact area between the foot and the top metallization layer that protrudes over the contact area not more than ¼ of a maximal diameter of the foot. The maximal diameter of the foot may be the maximal distance between two arbitrary points on the edge of the foot. For a circular foot, the maximal diameter may be the diameter of the circle defined by the edge of the foot. For a rectangular foot, the maximal diameter may be the length of the chord.

According to an embodiment of the invention, the dimples are distributed in a regular pattern. For example, neighbouring dimples may have equal distances and/or the dimples may be arranged in a rectangular shape and/or a hexagonal shape.

According to an embodiment of the invention, dimples are distributed along an edge of the foot on at least three sides of the foot. It also may be that the dimples are distributed in a pattern that follows some or all sides of the foot. For example, the dimples may be arranged in a rectangle or in the shape of an U.

According to an embodiment of the invention, the insulating substrate comprises a ceramics layer. In the lead and substrates based on ceramics may benefit from a welding process supported of dimples, since ceramics may be rather brittle. For example, the ceramics layer may be made of AlN, Al2O3 or SiN. In particular, AlN ceramics has a low fracture toughness compared to other standard power electronic ceramic materials.

According to an embodiment of the invention, the power semiconductor module comprises a base plate to which the insulating substrate is bonded with the bottom metallization layer. The base plate may be soldered to the bottom metallization layer. In this case, dimples may be provided in the bottom metallization layer between a ceramics substrate and the base plate. However, the power semiconductor module may have no base plate.

In this context it has to be noted, that insulating substrate also may comprise solely one metallization layer, i.e. the top metallization layer.

A further aspect of the invention relates to a method of manufacturing a power semiconductor module, for example the power semiconductor module as described in the above and in the following. It has to be understood that features of the method as described in the above and in the following also may be features of the power semiconductor module as described in the above and in the following, and vice versa.

According to an embodiment of the invention, the method comprises: providing an insulating substrate; generating a plurality of dimples in at least one of a top metallization layer and a bottom metallization layer of the insulating substrate, wherein the dimples are generated in a connection region for a terminal of the power semiconductor module; bonding a semiconductor chip to the top metallization layer; and welding a foot of the terminal to the top metallization layer in the connection region, such that the dimples are under and/or besides the foot.

In general, the dimples may be generated in the substrate before the welding by any method, for example by machining the one or more metallization layers.

According to an embodiment of the invention, the dimples are generated by etching at least one of the top metallization layer and the bottom metallization layer. The dimples may be realized in the same etching process in which the one or more metallization layers is structured for forming a conducting path on the substrate. No additional costs may be generated by the dimples. To realize dimples, the etching mask only may need to be adapted.

According to an embodiment of the invention, the foot of the terminal is at least one of friction welded and ultrasonic welded to the top metallization layer. The welding may be performed with a process, which includes a relative movement of the foot and the top metallization layer and/or mechanical pressure, such as ultrasonic welding. Such welding processes may cause high stress on the insulating layer of the substrate, which stress may be mitigated by the dimples.

These and other aspects of the invention will be apparent from and elucidated with reference to the embodiments described hereinafter.

BRIEF DESCRIPTION OF THE DRAWINGS

The subject-matter of the invention will be explained in more detail in the following text with reference to exemplary embodiments which are illustrated in the attached drawings.

FIG. 7 shows a schematic top view of a power semiconductor module according to an embodiment of the invention.

The reference symbols used in the drawings, and their meanings, are listed in summary form in the list of reference symbols. In principle, identical parts are provided with the same reference symbols in the figures.

DETAILED DESCRIPTION OF EXEMPLARY EMBODIMENTS

Figure 1:
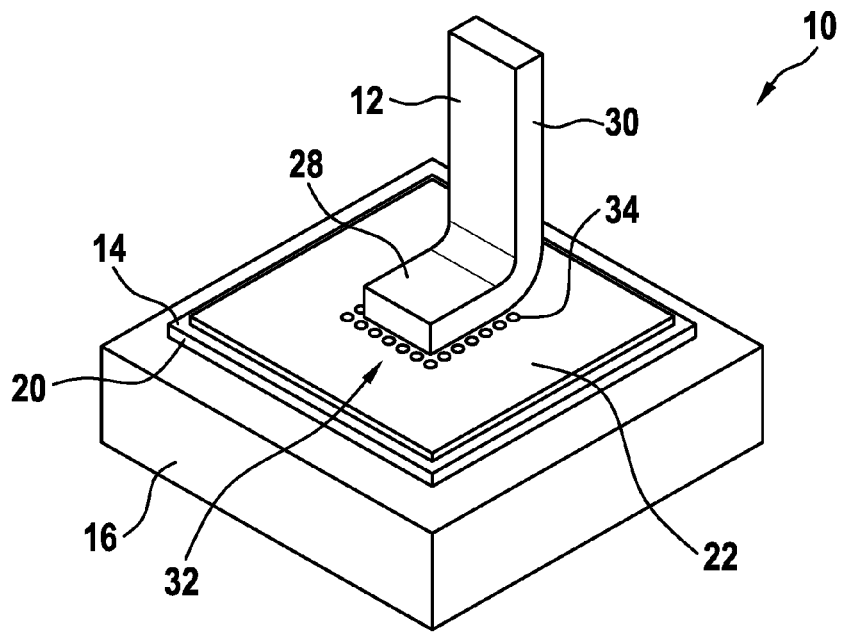
FIG. 1 schematically shows a perspective view of a part of a power semiconductor module according to an embodiment of the invention.
Figure 2:
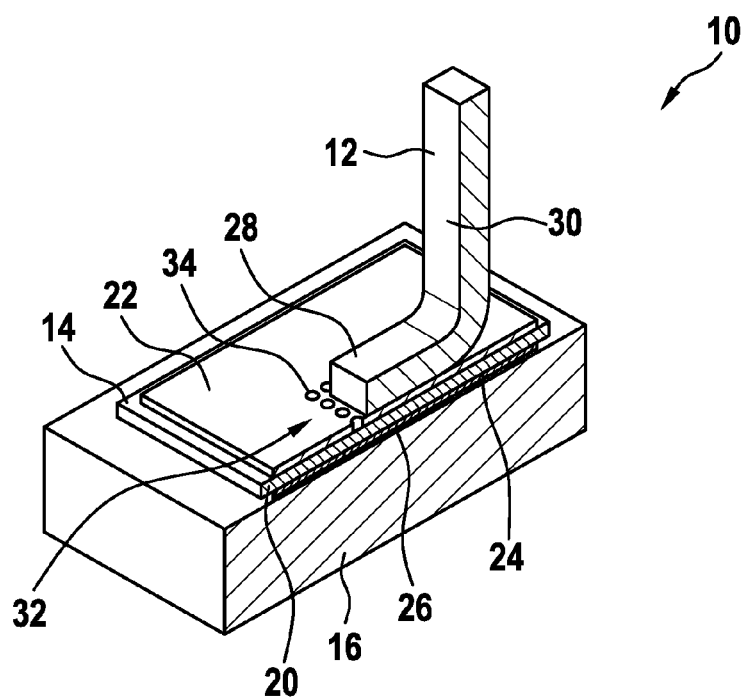
FIG. 2 shows a perspective cross-section through the part of the power semiconductor module of FIG. 1.

FIG. 1 shows a part of a power semiconductor module 10 in the region of a terminal 12. FIG. 2 shows the part in cross-section.

The power semiconductor module 10 comprises an insulating substrate 14, which is soldered to a base plate 16. The insulating substrate 14 comprises an intermediate ceramics layer 20, a top metallization layer 22 and a bottom metallization layer 24. FIG. 2 also shows a soldering layer 26 which interconnects the base plate 16 and the bottom metallization layer 24 of the substrate 14. For example, the base plate 16 may be a metal or composite plate substantially (such as 10 times) thicker than the substrate 14 and/or may be made of Cu, Al or AlSiC. The metallization layers 22, 24 may have the same or a different thickness and/or may be made of Cu, Al or other conductive metals. The ceramics layer 20, which may have a thickness from 1 to 10 times of the sickness of one of the metallization layers 22, 24, may be made of AlN, Al2O3 and SiN.

It has to be noted, that the base plate 16 and/or the bottom metallization layer 24 are optional and that the power semiconductor module may be attached to a cooling body, to a carrier and/or to a housing in other ways.

Furthermore, it may be possible that the base plate 16 is sintered to the bottom metallization layer 24.

FIGS. 1 and 2 furthermore show a terminal 12, which may be made of metal material, such as Cu, Al, etc. The terminal 12 has a substantially L-shaped form with a foot 28 and a pin part 30. The foot 28, which is welded to the top metallization layer 22, is aligned parallel to the substrate 14 and/or its layers 20, 22, 24. The pin part 30, which may be used for interconnecting an electrical conductor with the power semiconductor module 10, protrudes substantially orthogonal from the substrate 14 and/or its layers 20, 22, 24.

The terminal 12 may be a power terminal that is adapted for conducting a current switched by the power semiconductor module 10. Also, the terminal 12 may be an auxiliary terminal that is used for conducting auxiliary signals, such as a gate signal or sensor signals to and from the power semiconductor module 10.

The terminal 12 is welded to the top metallization layer 22 in a connection region 32 for the terminal 12 below the foot 28. In this connection region 32, a plurality of dimples 34 are provided, which may be provided around and/or under the foot 28 in at least one of the metallization layers 22, 24.

Figure 3:
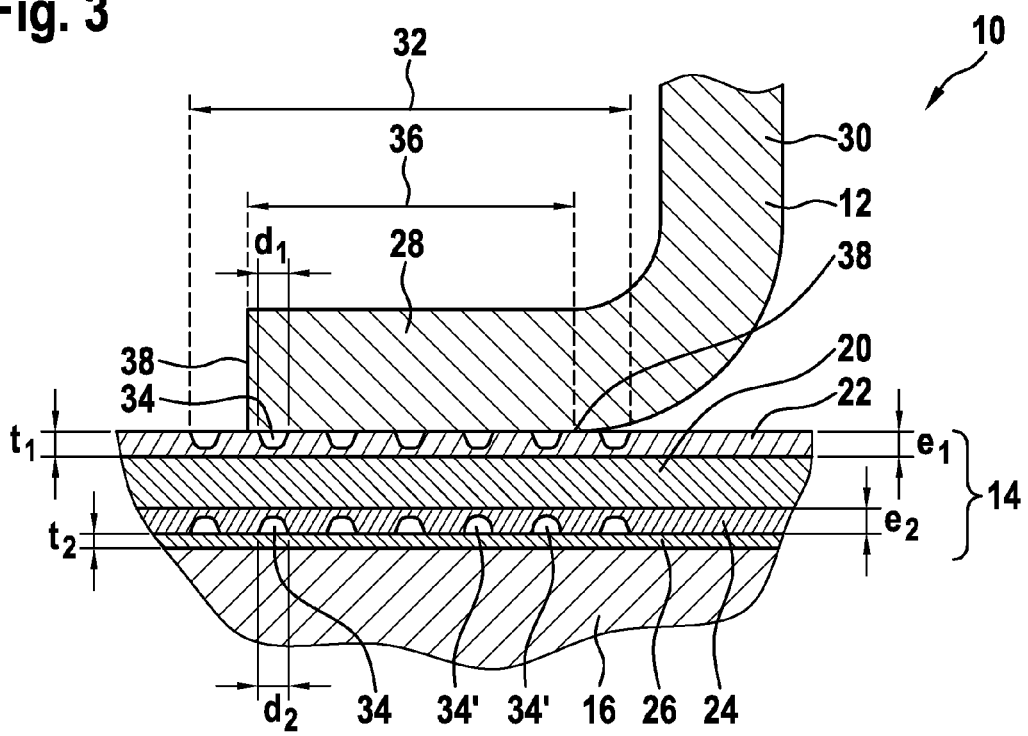
FIG. 3 shows a cross-section through a part of the power semiconductor module according to an embodiment of the invention.

FIG. 3 shows the vicinity of the foot 28 in more detail in a cross-section. The foot 28 is welded in the connection region 32 to the top metallization layer 22 and is in direct contact to the top metallization layer 22 in an area 36. As shown in FIG. 3, the connection region 32 may comprise the contact area 36 and/or may be larger than the contact area 36.

The connection region 32 may be defined via the dimples 34, wherein the dimples 34 associated with one foot 28 are only distributed within the connection region 32.

The dimples 34 may be generated with any method in one or both metallization layers 22, 24, for example by etching. The dimples 34 may have any shape. In FIG. 3, the dimples 34 in the top metallization layer 22 are conical. However, as shown for some exemplary dimples 34' in the bottom metallization layer 24, the dimples 34 also may have a spherical or other shape.

FIG. 3 shows, that the thickness $e_1$ of the top metallization layer 22 may be different from the thickness $e_2$ of the bottom metallization layer 24. However, these thicknesses also may be equal. The height $t_1$, $t_2$ of the dimples 34 may be smaller and/or equal to the thickness of the respective metallization layer 22, 24. For example, $e_{1/2}/4 \leq t_{1/2} \leq e_{1/2}$. As a particular example, the thicknesses of the layers 22, 24 may be $e_1 = e_2 = 0.3$ mm and the height $t_1$, $t_2$ of the dimples may be between 0.2 mm to 0.25 mm.

Furthermore, a diameter $d_1$, $d_2$ of the dimples 34 may be in the range of the thickness of the respective metallization layer 22, 24. The diameter $d_1$ of dimples 34 in the top metallization layer 22 may be different or equal to a diameter $d_2$ of dimples 34 in the bottom metallization layer 24. For example, $t_{1/2} \leq d_{1/2} \leq 4\, t_{1/2}$.

The dimples 34 may be provided in only one metallization layer 22, 24 or in both.

Figure 4:
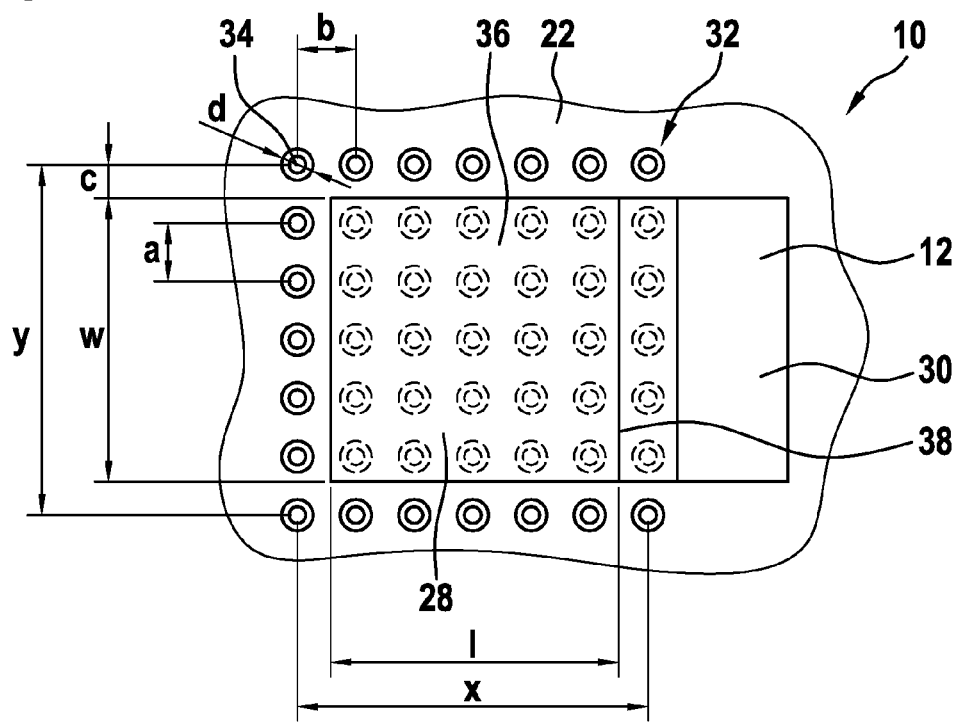
FIG. 4 shows a schematic top view on a terminal of a power semiconductor module according to an embodiment of the invention.

FIG. 4 shows a schematic top view onto the foot 28 of the terminal 12, which is welded to the top metallization layer 22 on a regular pattern of dimples 34. The dimples 34 are arranged in equally spaced rows and columns. It has to be noted, that the dimples 34 also may be arranged in other regular patterns.

In FIG. 4, it can be seen that the dimples 34 may be arranged outside or inside an edge 38 of the foot 28. The edge 38 of the foot may be defined as the outer border of the contact area 36. In FIG. 3 is shown, that dimples 34 also may be arranged below the edge 38.

FIG. 4 shows a center distance c between a dimple 34 and the foot 28 arranged outside of the edge 38 or the contact area 36. The center distance c may be chosen, such that a maximal distance from a dimple 34 to the foot 28 (or the edge 38) is at least ¼ of the maximal diameter of the foot 28.

In FIG. 4, the foot 28 and the contact area 36 are rectangular. FIG. 4 shows a width w of the contact area, a length l of the contact area, a maximal center distance y of dimples along the width direction, a maximal center distance x of dimples 34 along the length direction, a center distance a of neighboring dimples 34 along the width direction, a center distance b of neighboring dimples 34 along the length direction, a dimple diameter d.

In general, these quantities may fulfil the following inequalities:

$$w/4 < y < 4w, 1/4 < x < 4l$$

$$d < b < 1, d < a < w$$

In FIG. 4, the dimples 34 are arranged below the foot 28 within the contact area 36 and besides the foot 28 outside of the contact area 36. In particular, dimples are arranged outside of the contact area 36 on all sides of the foot 28.

Figure 5:
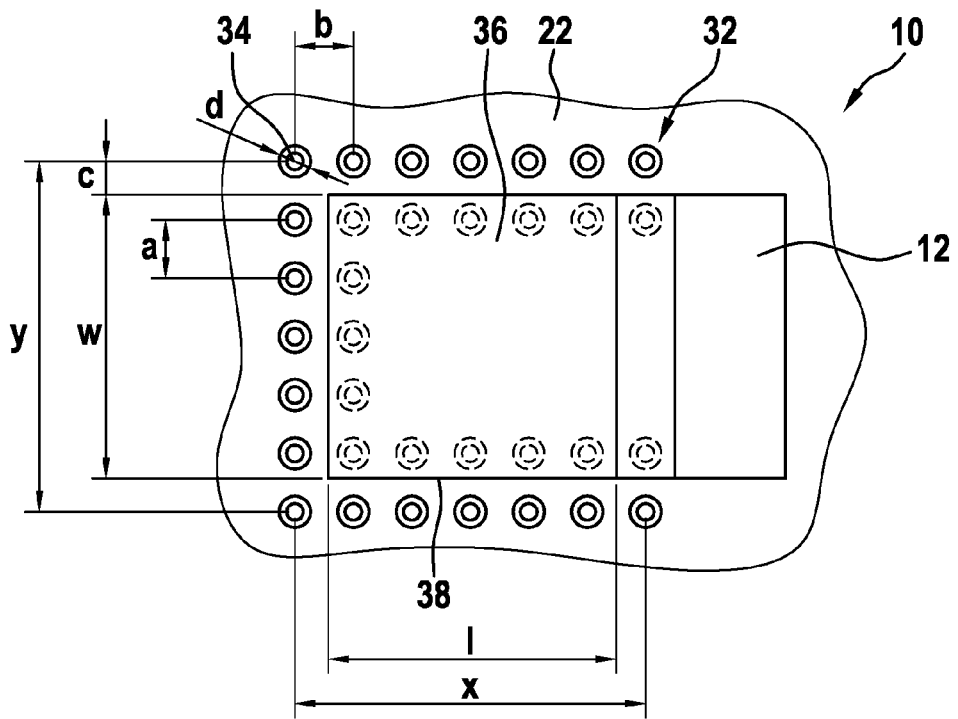
FIG. 5 shows a schematic top view on a terminal of a power semiconductor module according to a further embodiment of the invention.

As shown in FIG. 5, it may be, that the dimples 34 are arranged only along the edge 38 of the foot 28. The dimples 34 are arranged in a pattern forming a U. One row of dimples 34 runs around the edge 38 of the foot 28 outside of the contact area 36. A second row of dimples 34 runs around the edge 38 of the foot 28 inside of the contact area 36.

Figure 6:
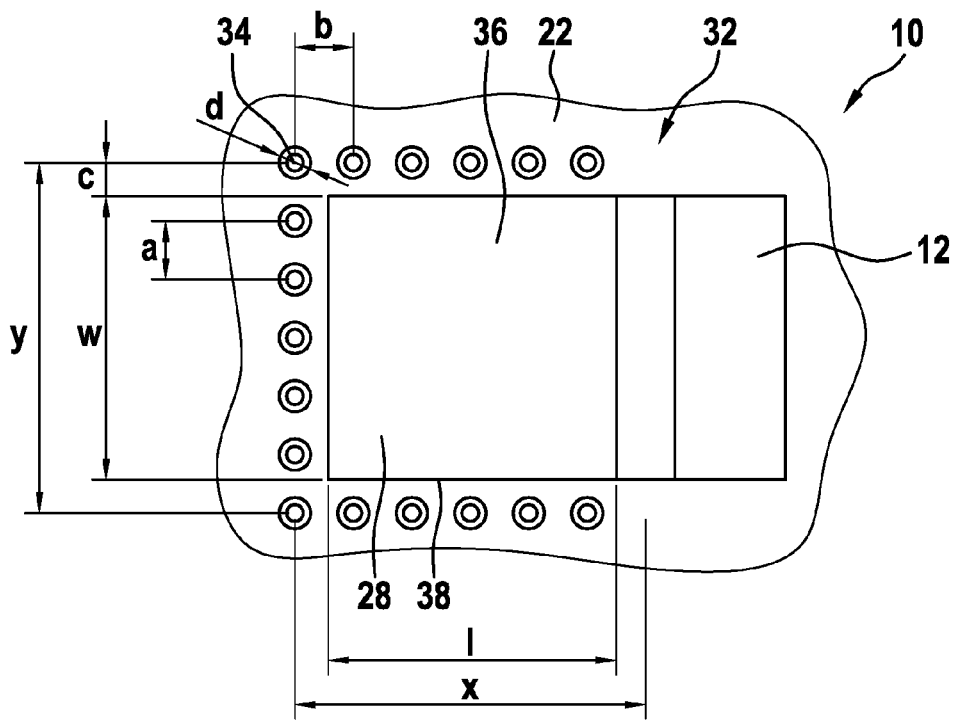
FIG. 6 shows a schematic top view on a terminal of a power semiconductor module according to a further embodiment of the invention.

FIG. 6 shows a further example, where dimples are solely arranged outside of the contact area 36. Again, the dimples 34 are arranged in a pattern forming a U. Only one row of dimples 34 runs around the edge 38 of the foot 28 outside of the contact area 36. Furthermore, the dimples 34 are only provided on the three sides of the foot 28 which are different from the side where the pin part 30 protrudes from the foot 28.

FIG. 7 shows a power semiconductor module 10 with several terminals 12 that have been welded to a top metallization layer 22 in a connection region 32 with dimples 34 as described in the above.

To the top metallization layer 22, semiconductor chips 40, such as diodes, and semiconductor switches are bonded, which are either directly electrically interconnected with the terminals 12 via the top metallization layer 22 or which are indirectly electrically connected with the terminal 12 via wirebonds 42.

The power semiconductor module 10 may be manufactured in the following way:

The insulating substrate 14 with one or two metallization layers 22, 24 may be provided. After that, a plurality of dimples 34 may be generated in at least one of the top metallization layer 22 and the bottom metallization layer 24 of the insulating substrate 14. For example, the dimples 34 may be generated by machining the top metallization layer 22.

Alternatively, the dimples 34 may be generated by etching at least one of the top metallization layer 22 and the bottom metallization layer 24. This etching may take place in the same etching step, in which the top metallization layer 22 is structured.

In both cases, the dimples 34 may be arranged as described in the above.

Before or after the generation of the dimple, the semiconductor chips 40 may be bonded to the top metallization layer 22, for example by soldering or sintering. Also the wirebonds 42 may be provided after the bonding of the semiconductor chips 40.

The dimples 34 may be generated solely in connection regions 32 for the terminals 12 of the power semiconductor module 10. Every terminal 12 may be associated with one connection region 32.

In its respective connection region, the foot 28 of the terminal 12 is welded to the top metallization layer 22 in the connection region 32. This welding may be performed before or after then bonding of the semiconductor chips 40. The welding may be performed by friction welding and/or ultrasonic welding. Due to the dimples, stress caused in the substrate due to a high temperature and/or a high pressure is mitigated by the dimples 34. In such a way, the occurrence of cracks in the ceramics layer 20 of the substrate 14 may be reduced.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS 10 power semiconductor module
12 terminal
14 insulating substrate
16 base plate
20 ceramics layer
22 top metallization layer
24 bottom metallization layer
26 soldering layer
28 foot
30 pin part
32 connection region
34, 34' dimples
36 contact area
38 edge
40 semiconductor chip
42 wirebonds

The invention claimed is:

1. A power semiconductor module, comprising:
an insulating substrate with a top metallization layer;
a semiconductor chip bonded to the top metallization layer; and
a terminal connected with a foot to the top metallization layer and electrically interconnected to the semiconductor chip;
wherein at least one of the top metallization layer and a bottom metallization layer of the insulating substrate provided opposite to the top metallization layer comprises a plurality of dimples, which are distributed in a connection region below the foot;
wherein at least one dimple is located outside an edge of the foot;
wherein the foot of the terminal is welded to the top metallization layer in the connection region; and
wherein the connection region protrudes out of under the foot at least ¼ of a maximal diameter of the foot and wherein the one or more dimples distributed outside of an edge of the foot have a maximal distance from the edge of the foot of less than ¼ of a maximal diameter of the foot.

2. The power semiconductor module of claim 1, wherein the dimples are distributed below the foot.

3. The power semiconductor module of claim 1, wherein all of the dimples are distributed below the foot.

4. The power semiconductor module of claim 1, wherein the dimples have a depth smaller than a thickness of an associated metallization layer or layers, the associated metallization layer or layers being the top metallization layer and/or the bottom metallization layer that comprises the plurality of dimples.

5. The power semiconductor module of claim 1, wherein the dimples reach through an associated metallization layer or layers, the associated metallization layer or layers being the top metallization layer and/or the bottom metallization layer that comprises the plurality of dimples.

6. The power semiconductor module of one claim 1, wherein neighboring dimples have a distance with respect to each other of less than three diameters of the dimples.

7. The power semiconductor module of one claim 1, wherein the dimples are distributed in a regular pattern.

8. The power semiconductor module of claim 1, wherein the at least one dimple comprises a plurality of dimples distributed along an edge of the foot on at least three sides of the foot.

9. The power semiconductor module of claim 1, wherein the insulating substrate comprises a ceramics layer made of at least one of aluminum nitride, aluminum oxide, and silicon nitride.

10. The power semiconductor module of claim 9, further comprising a base plate to which the insulating substrate is bonded with the bottom metallization layer, wherein one or more dimples are distributed in the bottom metallization layer between the ceramics layer and the base plate.

11. The power semiconductor module of claim 8, wherein all of the dimples of the at least one dimple are distributed only along the three sides of the foot.

12. The power semiconductor module of claim 8, wherein the dimples of the at least one dimple are distributed in an array beneath the foot.

13. A method of manufacturing a power semiconductor module, the method comprising:
providing an insulating substrate;
forming a plurality of dimples in at least one of a top metallization layer and a bottom metallization layer of the insulating substrate, wherein the dimples are formed in a connection region for a terminal of the power semiconductor module;
bonding a semiconductor chip to the top metallization layer; and
welding a foot of the terminal to the top metallization layer in the connection region, wherein at least one dimple comprises a plurality of dimples distributed along an edge of the foot only along three sides of the foot.

14. The method of claim 13, wherein the dimples are formed by etching the at least one of the top metallization layer and the bottom metallization layer.

15. The method of claim 13, wherein the foot of the terminal is at least one of friction welded and ultrasonically welded to the top metallization layer.

16. The method of claim 13, wherein the dimples have a depth smaller than a thickness of an associated metallization layer or layers, the associated metallization layer or layers being the top metallization layer and/or the bottom metallization layer that comprises the plurality of dimples.

17. The method of claim 13, wherein the insulating substrate comprises a ceramics layer made of at least one of aluminum nitride, aluminum oxide, and silicon nitride.

18. A power semiconductor device, comprising:
an insulating substrate with a top metallization layer;
a semiconductor chip bonded to the top metallization layer; and
a terminal connected with a foot to the top metallization layer and electrically interconnected to the semiconductor chip;
wherein at least one of the top metallization layer and a bottom metallization layer of the insulating substrate provided opposite to the top metallization layer comprises a plurality of dimples, which are distributed in a connection region below the foot;
wherein the foot of the terminal is welded to the top metallization layer in the connection region;
wherein the connection region protrudes out of under the foot at least ¼ of a maximal diameter of the foot; and
wherein dimples outside of an edge of the foot have a maximal distance from the edge of the foot of less than ¼ of a maximal diameter of the foot.

19. The power semiconductor device of claim 18, wherein all of the dimples are outside of the edge of the foot.

20. The power semiconductor device of claim 18, wherein a first group of the dimples are outside of the edge of the foot and a second group of the dimples are inside of the edge of the foot, the second group of dimples being distributed along edges of the foot.

21. The power semiconductor device of claim 18, wherein a first group of the dimples are outside of the edge of the foot and a second group of the dimples are inside of the edge of the foot, the second group of dimples being distributed in an array beneath the foot.

\* \* \* \* \*